US011204397B2

(12) United States Patent
Barrahma et al.

(10) Patent No.: US 11,204,397 B2
(45) Date of Patent: Dec. 21, 2021

(54) HALL PROBE

(71) Applicant: Luxembourg Institute Of Science And Technology (LIST), Esch-sur-Alzette (LU)

(72) Inventors: Rachid Barrahma, Soleuvre (LU); Olivier Bouton, Tressange (FR); David Dowsett, Schuttrange (LU); Tom Wirtz, Grevenmacher (LU)

(73) Assignee: Luxembourg Institute of Science and Technology (LIST), Luxembourg (LU)

( * ) Notice: Subject to any disclaimer, the term of this patent is extended or adjusted under 35 U.S.C. 154(b) by 0 days.

(21) Appl. No.: 16/317,306

(22) PCT Filed: Jul. 17, 2017

(86) PCT No.: PCT/EP2017/068045
§ 371 (c)(1),
(2) Date: Jan. 11, 2019

(87) PCT Pub. No.: WO2018/011436
PCT Pub. Date: Jan. 18, 2018

(65) Prior Publication Data
US 2019/0302197 A1 Oct. 3, 2019

(30) Foreign Application Priority Data

Jul. 15, 2016 (LU) .......................................... 93151

(51) Int. Cl.
*G01R 33/07* (2006.01)
*G01R 33/00* (2006.01)
(Continued)

(52) U.S. Cl.
CPC ........... *G01R 33/07* (2013.01); *G01R 15/207* (2013.01); *G01R 33/0047* (2013.01); *G01R 33/0076* (2013.01); *H01L 43/04* (2013.01)

(58) Field of Classification Search
CPC .. G01R 33/07; G01R 15/207; G01R 33/0047; G01R 33/0076; H01L 43/04
See application file for complete search history.

(56) References Cited

U.S. PATENT DOCUMENTS 2,562,120 A * 7/1951 Pearson ................. G01R 33/07
324/251
2,707,769 A * 5/1955 Shaper ................... G01R 33/07
324/251
(Continued)

FOREIGN PATENT DOCUMENTS

JP H11235755 A 8/1999
JP 2001091613 A2 4/2001
(Continued)

OTHER PUBLICATIONS

International Search Report for corresponding PCT/EP2017/068045 dated Sep. 9, 2017.
(Continued)

*Primary Examiner* — Lee E Rodak
(74) *Attorney, Agent, or Firm* — Sandberg Phoenix and von Gontard

(57) ABSTRACT

A Hall probe comprising a Hall effect sensing element. The probe is capable of precisely measuring the strength of a magnetic field in high-voltage and vacuum environments.

12 Claims, 2 Drawing Sheets

(51) Int. Cl.
*H01L 43/04* (2006.01)
*G01R 15/20* (2006.01)

(56) References Cited

U.S. PATENT DOCUMENTS

| | | | | |
|---|---|---|---|---|
| 5,159,194 | A * | 10/1992 | Marriott | H01J 49/022 |
| | | | | 250/294 |
| 5,608,319 | A * | 3/1997 | Maurer | G01R 33/07 |
| | | | | 324/103 P |
| 6,191,698 | B1 * | 2/2001 | Hennig | B64D 43/00 |
| | | | | 324/260 |
| 2005/0052844 | A1 * | 3/2005 | McCollum | H05K 5/0213 |
| | | | | 361/689 |
| 2010/0164483 | A1 | 7/2010 | Namai et al. | |
| 2011/0234215 | A1 * | 9/2011 | Ausserlechner | G01R 33/0047 |
| | | | | 324/244 |
| 2011/0260721 | A1 | 10/2011 | Fischer | |
| 2014/0165727 | A1 * | 6/2014 | Mueller | G01D 11/245 |
| | | | | 73/514.39 |
| 2016/0018476 | A1 | 1/2016 | Ooi et al. | |
| 2016/0217992 | A1 * | 7/2016 | O'Brien | G01N 30/7266 |
| 2016/0349387 | A1 * | 12/2016 | Rokkan | G01V 1/3808 |

FOREIGN PATENT DOCUMENTS

| | | |
|---|---|---|
| JP | 2006128213 A2 | 5/2006 |
| JP | 2015141121 A2 | 8/2015 |

OTHER PUBLICATIONS

International Preliminary Report on Patentability for corresponding PCT/EP2017/068045 dated Oct. 10, 2018.
International Written Opinion for corresponding PCT/EP2017/068045 dated Jun. 29, 2018.

* cited by examiner

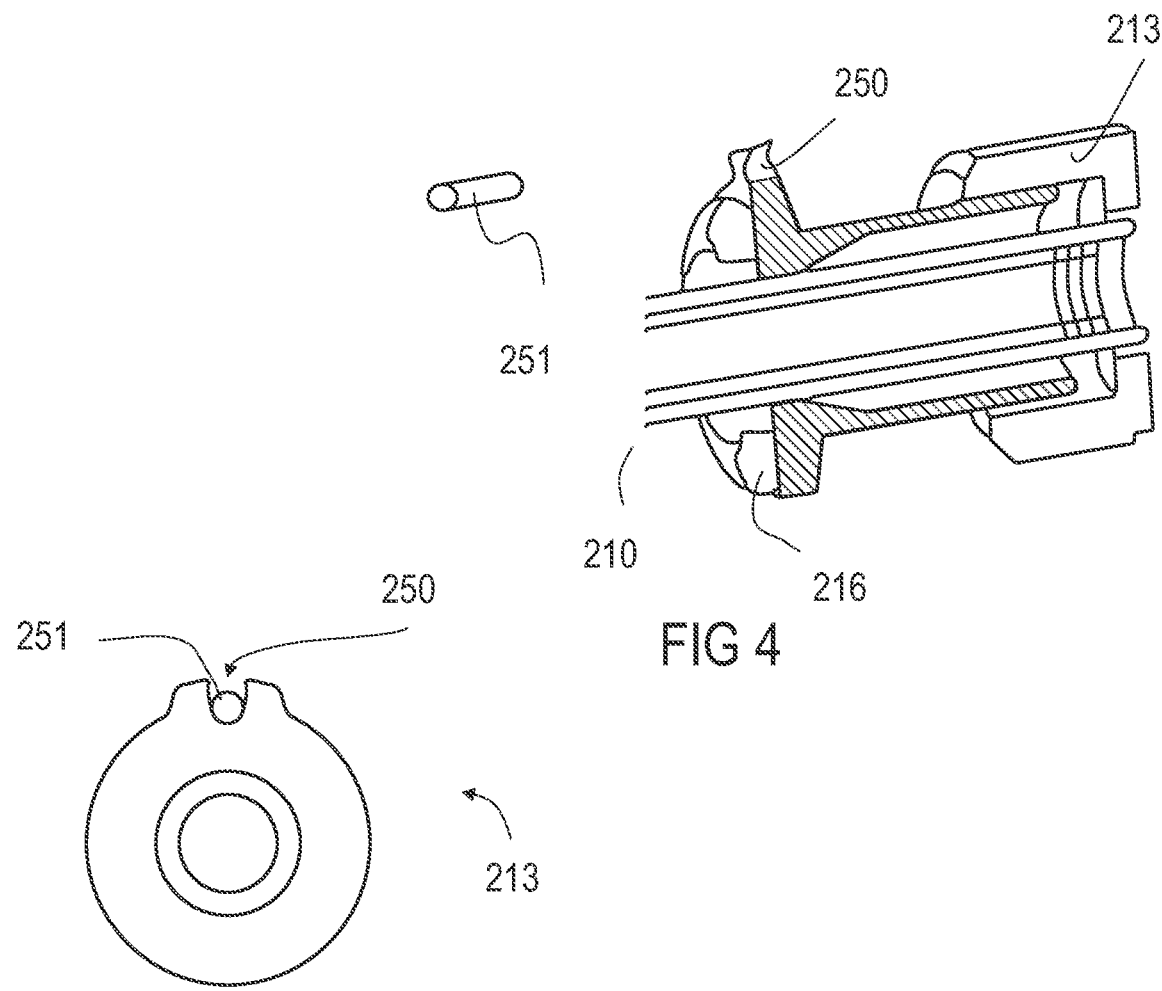
FIG 4
FIG 5
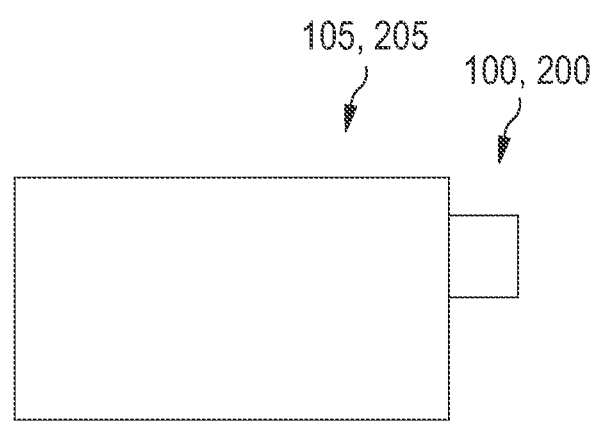
FIG 6

HALL PROBE

The present invention is the US national stage under 35 U.S.C. § 371 of International Application No. PCT/EP2017/068045, which was filed on Jul. 17, 2017, and which claims the priority of application LU 93151 filed on Jul. 15, 2016, the content of which (text, drawings and claims) are incorporated here by reference in its entirety.

FIELD

The invention is directed to a probe for measuring the strength of magnetic fields, more specifically to measuring the strength of magnetic fields in the context of secondary ion mass spectrometry devices.

BACKGROUND

A Hall effect sensor is a transducer that varies its output voltage in response to a magnetic field. The force exerted by the magnetic field on moving electrons of an electric current flowing through an electrical conductor in a magnetic field pushes the moving electrons to one side of the conductor, thus building up an excess of negative electrical charges on this side of the conductor and producing subsequently a voltage between those two sides. This voltage can be measured and used to feedback to the electronics that controls the magnetic field. The presence of this transverse voltage is called the Hall Effect and can therefore be detected through a Hall effect sensor. Generally, Hall effect sensors are very sensitive to changes in the ambient temperature conditions.

Secondary Ion Mass Spectrometry, SIMS, devices, often involve among other components a magnetic sector device defining a passage gap between its pole pieces. The ion beam formed by the ions that are to be analyzed using the SIMS device passes through the gap. The whole flight path of the ions is under vacuum to avoid collisions and contaminations. The magnetic field in the passage gap has a different impact on the trajectories of ions in the beam, depending on their mass to charge ratio. Therefore, the magnetic sector device is capable of separating the ions according to their intrinsic characteristics. The separated ions form a secondary ion signal that may at a subsequent stage be detected and identified by appropriate ion detection and identification means. Generally, a magnetic field controller is used to control the strength of the magnetic field, so that a stable secondary ion signal is received at the ion detector over long periods of time. More specifically, the magnetic field may be controlled by either electronic circuits that provide a constant electric current flowing through the coils inducing the magnetic field, or by incorporating a measuring device in the magnetic field that provides feedback information to the electronics, so to provide more precise control of the magnetic field. These measuring devices may comprise Hall probes that rely on a Hall effect sensor as described here above.

Japanese patent application, referenced JPH 11-235755 A, relates to an elongated flat Hall device sensor including a protective tube made of polyimide. The protective tube is employed to protect the wire.

US patent application, published U.S. Pat. No. 3,665,366 relates to a Hall probe which is resistant to extreme temperature variations, within a temperature range of −273° C. to +200° C. The Hall probe comprises a small rod of an electrically insulating material resistant to these extreme temperature changes (hardened glass). The rod is crossed by wires connected to a layer of semiconductor material. Such known Hall probes are not well suited for performing well in a vacuum environment, or in high voltage areas.

Japanese patent application, referenced JP 2001 091613, relates to a multichip module for a magnetic sensor having little magnetic influence on IC chips.

Japanese patent application, referenced JP 2015 141121 A, relates to configuration that suppresses erroneous detection of a magnetic field applied in a certain direction.

US patent application, published US 2016/0018476 A1, relates to a molded sensor package.

Japanese patent application, referenced JP 2006 128213, relates to a semiconductor device which can maintain a high detecting accuracy.

SUMMARY

It is an objective of the present invention to alleviate at least one of the drawbacks present in the prior art. In particular, the invention aims at providing a Hall probe that is capable of accurately sensing the strength of a magnetic field in a vacuum environment and in environments of high voltage.

It is an object of the invention to provide a Hall probe comprising handling means, an electrically insulated enclosure and a Hall effect sensor element. The Hall effect sensor element is enclosed in the electrically insulated enclosure and the walls of the enclosure comprise an electrically insulating material. The enclosure is mechanically connected to the handling means.

In various instances, the walls of the enclosure can comprise a vacuum tight cap made of an electrically insulating material, and a surface portion of the handling means. The enclosure can in various instances be connected to the handling means by connection means, comprising vacuum sealing means.

The electrically insulating material can in various instances be glass.

The Hall effect sensor element can in various instances have a flattened shape.

In various instances, the enclosure can have a flattened shape.

The enclosure can in various instances extend along a longitudinal axis. The Hall effect sensor element can in various instances be centrally arranged in the enclosure with respect to the height and width thereof.

The handling means and enclosure can in various instances extend along a common longitudinal axis.

In various instances, the connection means can comprise a washer.

The vacuum sealing means can in various instances comprise an O-ring lodged in a corresponding seat of the handling means.

The connection means can further in various instances comprise holding means for holding the Hall effect sensor element.

In various instances, the connection means and handling means can further comprise electrical conductors operatively connected to the Hall effect sensor element, for transporting an electrical signal generated by the Hall effect sensor element.

According to a further aspect of the invention, the use of a Hall probe according to the invention is provided, for measuring a magnetic field in a gap formed between two pole pieces of a magnet, the pole pieces being floated at an electric potential of at least 1 kV. The electric potential can be higher than 1 kV, for example up to 20 kV.

In various instances, the pole pieces can be parts of a magnetic sector of a secondary ion mass spectrometry, SIMS, device.

The Hall probe in accordance with the present invention provides the Hall effect sensor element with isolation from high voltage. By enclosing the Hall effect sensor in a specifically designed glass tube, it becomes possible to use the probe for measuring the magnetic field in high voltage environments, such as for example between the pole pieces of a magnet floated at a high electric potential. The Hall probe uses precision machined parts to ensure the correct orientation of the Hall effect sensor element with respect to the magnetic field that is to be sensed. This allows improving the precision of measurement compared to known Hall probes.

As the Hall effect sensor element is kept at ambient temperature and pressure and is shielded from the surrounding environment, it can be used to measure magnetic fields in other environments than vacuum, e.g. high pressures, in liquids, or in hazardous/corrosive environments.

DRAWINGS

Several embodiments of the present invention are illustrated by way of figures, which do not limit the scope of the invention.

FIG. 4 is a perspective transversal cut of the locking mechanism of the device according to various embodiments of the invention.

FIG. 5 is a frontal view of the locking mechanism of the device according to various embodiments of the invention.

FIG. 6 is a schematic view of a secondary ion mass spectrometer provided with a Hall probe according to the invention.

DETAILED DESCRIPTION

This section describes the invention in further detail based on various preferred embodiments and on the figures. Unless otherwise stated, features in one described embodiment can be combined with additional features of another described embodiment.

Similar reference numbers will be used to denote similar concepts among different embodiments of the invention. For example, reference numbers 100 and 200 both denote a Hall probe according to two different embodiments of the invention.

Figure 1:
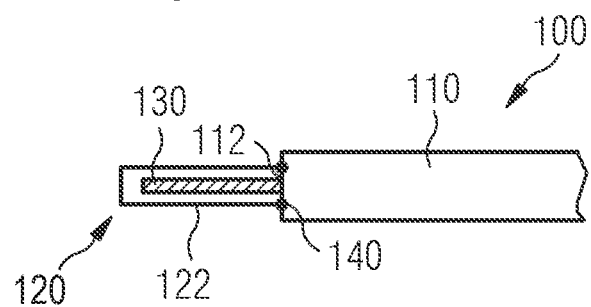
FIG. 1 is a schematic illustration of a transversal cut view of the device according to various embodiments of the invention.

FIG. 1 provides a schematic view of a Hall probe 100 according to various embodiments of the invention. The probe 100 comprises at a proximal end thereof a handle 110, using which it can be held in, or fixed to, a predetermined location. Although other geometric configurations are possible, in the example shown, the probe extends distally of the handle 110 along a longitudinal axis which corresponds to the horizontal direction on FIG. 1. A Hall effect sensor element 130 is fixed to the handling means or handle 110 and extends from a base 112 thereof. The Hall effect sensor element is a transducer that varies its output voltage in response to a magnetic field in which it is located. The output voltage signal is transmitted to any connected device using non-illustrated electrical connection means, such as conducting wires arranged through the handling means 110.

The Hall effect sensor element is included in a pressure sealed enclosure 120. The walls of the enclosure 120 comprise a glass cap 122 and at least a part of the wall 112 of the handle 110, onto which the glass cap is mechanically fixed. Alternatively, the enclosure walls can be entirely made of glass, the glass enclosure being itself fixed to a wall 112 of the handle 110. The walls of the enclosure can comprise other materials, provided that they are permeable to a magnetic field that is to be sensed by the Hall effect sensor element 130, and electrically insulating. As glass is resistant to high vacuum levels, provided probe is capable of operating in high vacuum environments. Specifically, as glass is also a high voltage insulator, the proposed configuration allows the probe to be used in high-voltage fields.

The fixation of the glass cap 122 to the handling means 110 is such that the atmosphere inside the enclosure 120 is tightly sealed from the surrounding atmosphere. To that end, vacuum sealing means 140 such as an airtight O-ring are provided. As illustrated in FIG. 1, the Hall effect sensor element 130 is in various instances enclosed centrally inside the enclosure 120. Both have in various instances an elongated and flattened shape.

Figure 2:
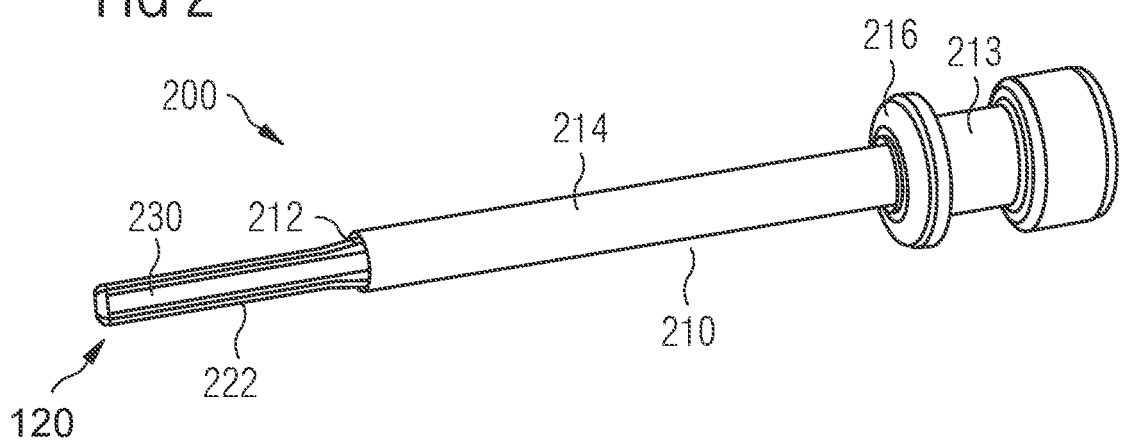
FIG. 2 is a perspective illustration of the device according to various embodiments of the invention.
Figure 3:
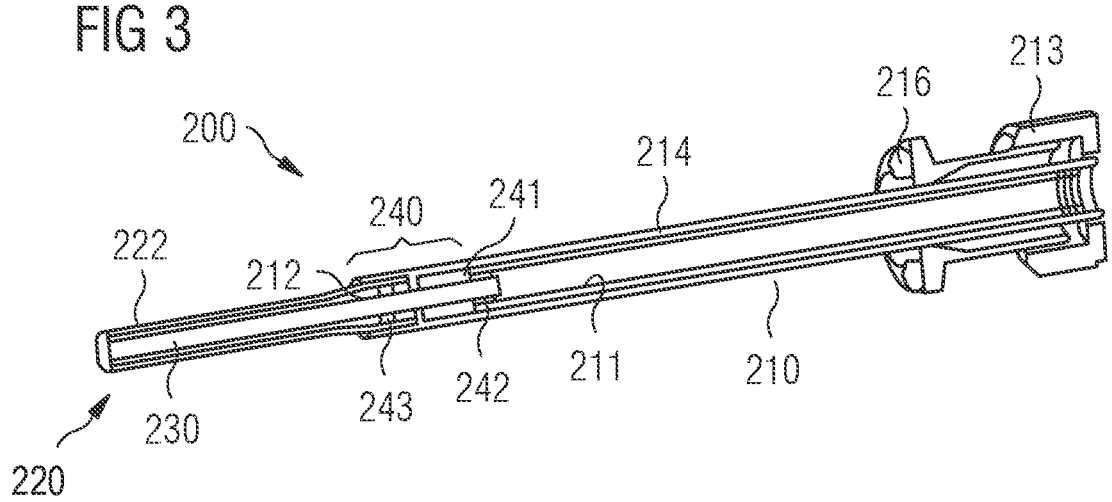
FIG. 3 is a perspective transversal cut of the device illustrated in FIG. 2, in accordance with various embodiments of the invention.

A further embodiment of the Hall probe 200 according to various embodiments of the invention is illustrated by FIGS. 2 and 3. The probe 200 comprises at a proximal end thereof a handle 210, using which it can be held at, or fixed to, a predetermined location. The proximal extremity of the handling means 210 comprises a quick locking mechanism 213 capable of locking the Hall probe reliably and repeatably to corresponding docking port of an external device.

A hollow steel rod 214 extends from the locking mechanism 213 in the direction of the distal extremity of the probe 200. The stainless steel rod 214 is fixed to the quick locking mechanism 213 by means of, for example, an O-ring 216. Inside the stainless steel rod 230, a Polyether ether ketone, PEEK, pipe 211 is lodged. A Hall effect sensor element 230 is attached to the handling means using connection means 240. In various instances, the Hall effect sensor element 230 is fixed to the pipe 211 by means of a precision machined part 241 connected to the pipe 211 using sealing means 242. The precision machined part 241 is shaped so that it holds the Hall effect sensor element 230 precisely in parallel to the main axis of the probe 200. A PEEK washer and a system of sealing rings 243 further ensures that the glass cap 222, which surrounds the Hall effect sensor element 230, is sealably connected to the handling means 210 of the probe. The depicted exemplary sealing ring 243 is lodged in a corresponding seat of the handling means 210.

The glass cap 222 is shaped so as to tightly enclose the Hall effect sensor element 230. In various instances, it extends about 5 to 6 cm, and in various instances 5.4 cm, from the distal base surface 212 of the handling means 210. Having a flattened shape, the glass cap 222 has a breadth of about 7 to 8 cm, in various instances 7.6 cm. The height of the glass cap 222 is of about 3 to 4 cm, and in various instances 3.6 cm. Other dimensions are possible while remaining within the scope of the present invention, solely depending on the field of application in which the Hall probe is to be put to use.

As the Hall probe in accordance with various embodiments of the present invention can be kept shielded electrically and in terms of temperature, pressure, from its surrounding environment, it can be used to measure magnetic field in a plurality of environments, arising in diverse specific applications.

The Hall probe in accordance with various embodiments of the present invention finds particular use in a secondary ion mass spectrometry, SIMS, device having magnetic pole pieces floated at high electrical potential upwards of 1 kV. Typically the high voltage range extends to about 20 kV.

In such a device, a primary ion beam is directed towards the surface of a sample. This extracts secondary ions from the sample's surface. The secondary ion beam is focused and accelerated using an electrode assembly, before entering a separation device formed by a magnetic sector, which can also be floated at a high electrical potential. The focused secondary ion beam passes through a gap formed between the pole pieces of the magnetic sector, which is located in a vacuum enclosure.

The passage gap has a height of about 5 mm and it is important to make sure that the magnetic field throughout the gap is uniform and well controlled. A uniform magnetic field improves the overall detection capability and mass resolution of the SIMS device. To that end, the Hall probe in accordance with the present invention, which is capable of measuring a magnetic field in high voltage environments and which is resistant to vacuum, is inserted into the pole piece gap. Specifically, the glass enclosure 120, 220 comprising the flattened Hall effect sensing element 130, 230 is inserted into the gap. The signal sensed by the Hall probe can then be used as feedback to control the strength of the magnetic field between the pole pieces, which is induced using a coil arrangement.

The configuration of the probe in accordance with the invention, and in particular the shape of the sensing element and glass cap, allows for a precise orientation of the probe inside the relatively tight pole piece gap. The most accurate signal is acquired when the flat sensing element is aligned parallel to the pole gap, and is perpendicular to the magnetic field.

To further ensure the alignment of the probe inside the pole piece gap, the handling means comprises a precision machined slot 250, as shown on FIGS. 4 and 5. This slot forms a counter-party to a precision machined pin 251 located on the SIMS spectrometer, more precisely on the flange of the SIMS spectrometer. When mounted on the SIMS spectrometer the combination of pin and counter-party slot ensures that the Hall Probe is mounted in a single well-defined orientation and the sensing element is in a perpendicular orientation to the magnetic field.

The reverse situation is also possible: the pin can be on the Hall probe and the counter-party slot the flange of the SIMS spectrometer.

FIG. 6 shows schematically a secondary ion mass spectrometer 105 or 205 with a flange onto which a Hall probe 100 or 200 is mounted.

The invention claimed is:

1. A Hall probe, said probe comprising:
   a handling means;
   an enclosure; and
   a Hall effect sensor element,
   wherein the Hall effect sensor element is enclosed in the enclosure, wherein the enclosure is mechanically connected to the handling means, at a distal end of said handling means, and wherein the handling means and enclosure extend along a common longitudinal axis, and
   wherein the enclosure is electrically insulated, the walls of the enclosure comprising a vacuum tight cap made of an electrically insulating material, and a surface portion of the handling means, such that the atmosphere inside the enclosure is tightly sealed from a surrounding atmosphere;
   wherein a proximal end of the handling means comprises a quick locking mechanism capable of locking the Hall probe to a corresponding docking port of a spectrometer.

2. The Hall probe according to claim 1, wherein the enclosure is connected to the handling means by connection means comprising vacuum sealing means.

3. The Hall probe according to claim 2, wherein the connection means further comprise holding means for holding the Hall effect sensor element.

4. The Hall probe according to claim 2, wherein the connection means and handling means further comprise electrical conductors operatively connected to the Hall effect sensor element, for transporting an electrical signal generated by the Hall effect sensor element.

5. The Hall probe according to claim 1, wherein the electrically insulating material is glass.

6. The Hall probe according to claim 1, wherein the Hall effect sensor element has a flattened shape.

7. The Hall probe according to claim 1, wherein the enclosure has a flattened shape.

8. The Hall probe according to claim 1, wherein the Hall effect sensor element is centrally arranged in the enclosure with respect to the height and width thereof.

9. The Hall probe according to claim 1, wherein the handling means comprises a longitudinal slot structured and designed for engaging with a pin on a spectrometer to ensure a single orientation around the common longitudinal axis.

10. The Hall probe according to claim 1, wherein the vacuum sealing means comprise an O-ring lodged in a corresponding seat of the handling means and engaging with the vacuum tight cap made of glass.

11. A secondary ion mass spectrometer, said spectrometer comprising;
    a Hall probe, the Hall probe comprising:
       a handling means;
       an enclosure; and
       a Hall effect sensor element,
       wherein the Hall effect sensor element is enclosed in the enclosure,
    wherein the enclosure is mechanically connected to the handling means, at a distal end of said handling means, and wherein the handling means and enclosure extend along a common longitudinal axis, and
    wherein the enclosure is electrically insulated, the walls of the enclosure comprising a vacuum tight cap made of an electrically insulating material, and a surface portion of the handling means, such that the atmosphere inside the enclosure is tightly sealed from a surrounding atmosphere;
    wherein a proximal end of the handling means comprises a quick locking mechanism capable of locking the Hall probe to a corresponding docking port of a spectrometer.

12. A Hall probe, said probe comprising:
    a handling means;
    an enclosure; and
    a Hall effect sensor element,
    wherein the Hall effect sensor element is enclosed in the enclosure, wherein the enclosure is mechanically connected to the handling means, and wherein the handling means and enclosure extend along a common longitudinal axis, and wherein the enclosure is electrically insulated, the walls of the enclosure comprising a vacuum tight cap made of an electrically insulating material, and a surface portion of the handling means, such that the atmosphere inside the enclosure is tightly sealed from a surrounding atmosphere;

wherein the handling means comprises a longitudinal slot structured and designed for engaging with a pin on a spectrometer to ensure a single orientation around the common longitudinal axis.

\* \* \* \* \*